United States Patent
Ahmad et al.

(10) Patent No.: US 8,021,898 B2
(45) Date of Patent: Sep. 20, 2011

(54) METHOD AND APPARATUS FOR CONTROLLED THERMAL PROCESSING

(75) Inventors: Iftikhar Ahmad, Raleigh, NC (US); Keith R. Hicks, Garner, NC (US)

(73) Assignee: Lambda Technologies, Inc., Morrisville, NC (US)

( * ) Notice: Subject to any disclaimer, the term of this patent is extended or adjusted under 35 U.S.C. 154(b) by 0 days.

(21) Appl. No.: 12/807,994

(22) Filed: Sep. 17, 2010

(65) Prior Publication Data

US 2011/0076786 A1  Mar. 31, 2011

Related U.S. Application Data

(60) Provisional application No. 61/277,542, filed on Sep. 25, 2009.

(51) Int. Cl.
*G01R 31/26* (2006.01)

(52) U.S. Cl. .......... 438/14; 438/308; 438/378; 438/795; 257/E21.529; 374/9; 374/103; 356/43; 392/411; 392/416; 219/411; 219/494

(58) Field of Classification Search ............. 438/308, 438/378, 795, 14; 374/9, 130; 356/43; 392/411, 392/416; 219/411, 395, 494
See application file for complete search history.

(56) References Cited

U.S. PATENT DOCUMENTS

| | | | | |
|---|---|---|---|---|
| 3,747,408 A | * | 7/1973 | Stanworth et al. | 374/125 |
| 4,815,841 A | * | 3/1989 | Bickler et al. | 356/43 |
| 7,642,205 B2 | * | 1/2010 | Timans | 438/795 |
| 2006/0228897 A1 | * | 10/2006 | Timans | 438/758 |
| 2008/0002753 A1 | * | 1/2008 | Timans | 374/2 |
| 2008/0318347 A1 | * | 12/2008 | Yasuda | 438/14 |

* cited by examiner

*Primary Examiner* — Hsien Ming Lee
(74) *Attorney, Agent, or Firm* — Robert J. Lauf

(57) ABSTRACT

A materials processing system comprises a thermal processing chamber including a heating source, a first noncontacting thermal measurement device positioned to measure temperature on a first area of the material being processed, and, a second noncontacting thermal measurement device positioned to measure temperature on a second area of the material being processed, the first device being relatively more sensitive to changes in surface emissivity than the second device. By comparing the outputs of the two devices, emissivity changes can be detected and used as a proxy for some physical change in the workpiece and thereby determine when the desired process has been completed. The system may be used to develop a process recipe, or it may be part of a system for real-time process control based on emissivity changes. Applicable processes include heating, annealing, dopant activation, silicide formation, carburization, nitridation, sintering, oxidation, vapor deposition, metallization, and plating.

32 Claims, 6 Drawing Sheets

METHOD AND APPARATUS FOR CONTROLLED THERMAL PROCESSING

CROSS REFERENCE TO RELATED APPLICATION

This application claims the benefit of U.S. Provisional Application Ser. No. 61/277,542, filed on Sep. 25, 2009 by the present inventors, the entire disclosure of which is incorporated herein by reference.

BACKGROUND OF THE INVENTION

1. Field of the Invention

The invention pertains to the field of heat treating materials using microwave energy. More particularly the invention pertains to apparatus and methods for heating silicon wafers while monitoring the wafer temperature.

2. Description of Related Art

Furnace annealing is a process used in semiconductor device fabrication wherein a batch of semiconductor wafers is heated in order to affect their electrical properties. Wafers can be heated in order to activate dopants, change film-to-film or film-to-wafer substrate interfaces, change states of grown films, densify deposited films, repair damage from implantation, diffuse dopants or drive dopants from one film into another or from a film into the wafer substrate. Because these furnaces are capable of processing large batches of wafers at a time each process may last from several hours up to a day.

It was predicted that 300-mm wafers marked the end of furnace era. Although there has been a move toward single-wafer systems for Rapid Thermal Process (RTP) or Anneal (RTA), the furnace based anneals haven't disappeared and there has been a strong base of furnace processes required for 300-mm wafers. The RTP or RTA processes have thermal cycles for each wafer that is of the order of minutes rather than hours for furnace anneal. Rapid thermal annealing is applied to UltraShallow Junctions (USJ), silicide formation and oxidation.

UltraShallow Junctions

Semiconductor fabrication processes use many steps of ion implantation to create a completed semiconductor device. The primary parameters of ion implantation are species (N-type and P-type), energy and dose. N-type dopants are usually arsenic or phosphorus and P-type doping is usually boron. The energy determines how deep the ions go into the silicon. Higher energy implants go deep while low energy implants are shallow. The dose determines how conductive the layer will be when complete. All of these parameters are chosen by the transistor designer for each implant step to optimize the device characteristics.

During the ion implantation process the heavy ions easily knock out silicon atoms and silicon crystal structure is damaged. The wafer and fabricated devices need to be annealed to activate the dopant and provide conductivity. Key elements in forming USJ are junction depth and sheet resistance, and process manufacturability and repeatability. These shallow junctions demand low thermal budgets, requiring processing at a high ramp rate with minimal peak temperature overshoot. The steep thermal profiles give the best junction characteristics by limiting dopant diffusion but challenges the ability to deliver consistent process uniformity and repeatability. The primary challenge is production worthiness, measured by within-wafer uniformity and wafer-to-wafer repeatability, to get product yield from the wafer edge especially as device geometries shrink, where an even shallower junction must be ensured.

Nickel Silicide

Metal silicides have been widely applied to IC fabrication because of their high melting points and low resistance. As the critical dimensions for contact area and source/drain regions are getting smaller and smaller nickel silicide is emerging to be the choice of material over cobalt and titanium silicide. Nickel silicide is fabricated by first forming a thin film of nickel, for instance by evaporating or sputtering, on the selected area of the semiconductor substrate. The semiconductor substrate is then heated so that the thin nickel film reacts with silicon to form the silicide layer. Another advantage in the formation of NiSi is that it consumes considerably less Si from the substrate as compared to cobalt silicide.

However, the nickel-silicon system has various phases (i.e., the phase diagram is more complex than the Co—Si system) and typically undergoes phase transformation during the heating cycle. Table I below shows these phases and some of the physical properties such as the resistivity and their melting temperatures, average Young's modulus and average coefficient of thermal expansion (CTE).

TABLE 1

Comparison of some physical properties of Ni, silicide phases, and Si. The average CTE and Young's Modulus represent values for polycrystalline thin films and can vary significantly in the crystalline direction.

| Phase | Ni | $Ni_3Si$ | $Ni_{31}Si_{12}$ | $Ni_2Si$ | $Ni_3Si_2$ | NiSi | $NiSi_2$ | Si |
|---|---|---|---|---|---|---|---|---|
| Crystal Structure | Cubic | Cubic | Hex. | Orth. | Orth. | Orth. | Cubic | Cubic |
| Resistivity ($\mu\Omega cm$) | 7-10 | 80-90 | 90-150 | 24-30 | 60-70 | 10-18 | 34-50 | Dopant dependent |
| Transformation/ Melting (° C.) | 1455 | 1035/1170 | 1242 | 1255/1306 | 830/845 | 992 | 981/993 | 1414 |
| Avg. Young's Modulus (GPa) | 200 | 139 | 177 | 161 | 167 | 132 | | 130-187 |
| Avg. CTE thin films ($\times 10^{-6}$/K) | 13.4 | 9.0 | | 16.5 | | ~12 | | 2.6 |

(Adapted from Silicide Technology for Integrated Circuits, By L. J. Chen, Institute of Electrical Engineers)

Among all the phases listed above the lowest resistivity NiSi is the desired silicide phase for contacts to a semiconductor device. Because there is phase transformation occurring during the heating or annealing cycle, there is a need to monitor the temperature of the substrate as well as the formation of the desired phase.

The crystallographic orientation changes during the thermal exposure, thus techniques such as X-ray reflectance (XRR) and X-ray diffraction (XRD) are used to record the crystalline structure of the phases. During the phase transformation from Ni to silicides, $Ni_3Si$ is generally the first silicide to form, but it may not be easily detected using XRD since both Ni and $Ni_3Si$ have a cubic lattice structure. The first silicide phase that can be distinctly identified with XRD is $Ni_{31}Si_{12}$, which has a hexagonal structure. Similarly, the identification of NiSi will not be easy since the $Ni_2Si$ and $Ni_3Si_2$ phases are also orthogonal. However, the resistivity of each phase varies significantly, therefore the X-ray data and resistivity measurements together help in identification of the desired phase.

Oxidation

Insulating dielectric layers are a key element in semiconductor device fabrication, which provide isolation between conductive layers on the surface of the wafer. In fact, one of the most important reasons silicon has become such a successful medium for integrated microelectronics is that silicon oxidizes and forms a good native oxide, $SiO_2$. At elevated temperatures (800-1200° C.) the oxide grows quickly and the advantage of native thermal oxides is that they have similar material properties (e.g. thermal expansion coefficient, lattice size, etc.) of the native material. The oxide growth does not create significant stresses in the material that can lead to serious problems including circuit failure. Oxidation can be carried out in a dry or wet environment. Wet oxidation is preferred over dry oxidation for growing thick oxides, because of the higher growth rate. However, fast oxidation leaves more dangling bonds at the silicon interface, which allows current to leak along the interface. Wet oxidation also yields a lower density oxide with lower dielectric strength. Since a long time is required to grow a thick oxide in dry oxidation, thicker oxides are usually grown with a short dry cycle followed by long wet oxidation and then another short dry oxidation (a dry-wet-dry cycle). The beginning and ending dry oxidations produce films of high-quality oxide at the outer and inner surfaces of the oxide layer, respectively.

Rapid thermal processing has been applied to all the processes described above. Lamp-based RTP spike-anneal has enabled recent production while laser spike-anneal (LSA) is emerging and even being claimed as the process of record for current high performance semiconductor device manufacturing.

In a production environment, flexibility to handle wafer variations with different emissivities and product types is essential. The high temperature spikes may also lead to warping of the wafer and uncontrollable strain in the device structure. Thus the successful integration of any type of anneal requires controlled, low thermal budget history to ensure minimal deformation and process-induced stresses.

In view of some of the above concerns, there is a clear need for improved annealing processes and reliable in-situ monitoring of the progress of the process.

Objects and Advantages

Objects of the invention include: providing a rapid processing method for annealing semiconductor devices; providing a method for monitoring a rapid thermal annealing process; providing a method for monitoring a microwave heating process; providing a method for in situ process control based on real-time measurement of emissivity; providing a method for lower temperature anneal rather than a temperature spike anneal; providing a method for thermal treatment that reduces stress and warpage of the workpiece; providing a method for thermal treatment having in-situ feedback and lower process temperatures, providing a method for thermal treatment that reduces temperature excursions; and, providing a method for thermal treatment that is suitable for automated control based on the feedback of process status.

SUMMARY OF THE INVENTION

According to one aspect of the invention, an apparatus for processing semiconductors comprises: a thermal processing chamber including a heating source; a first noncontacting thermal measurement device positioned to measure temperature on a first area of the semiconductor; and a second noncontacting thermal measurement device positioned to measure temperature on a second area of the semiconductor, the first device being relatively more sensitive to changes in surface emissivity than the second device.

According to another aspect of the invention, a method for processing semiconductors includes the following steps:
a) placing the semiconductor in a thermal processing chamber;
b) positioning a first noncontacting thermal measurement device to measure temperature on a first area of the semiconductor device;
c) positioning a second noncontacting thermal measurement device to measure temperature on a second area of the semiconductor device, the first device being relatively more sensitive to changes in surface emissivity than the second device;
d) heating the semiconductor while simultaneously measuring the output of the first and second thermal measurement devices and using the difference in outputs between the first and second thermal measurement devices to control at least one processing variable.

DETAILED DESCRIPTION OF THE INVENTION

Figure 1:
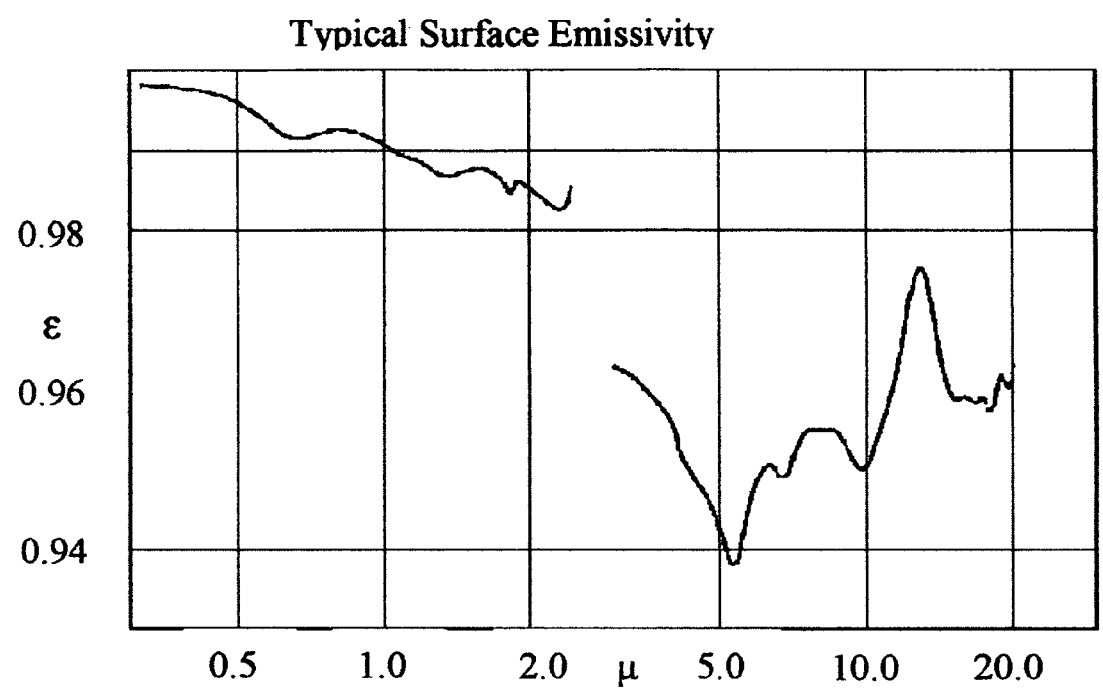
FIG. 1 shows a plot of the typical emissivity of a surface. Note that the emissivity of the same surface changes with the wavelength.

The invention provides a rapid processing technique for the annealing of semiconductor devices while simultaneously monitoring the process in situ. The various processes include dopant activation in ultra shallow junctions, oxidation of silicon as well as the fabrication of a metal silicide while monitoring the phase transformation shown above (as an example) in Table 1.

The rapid processing approach involves the use of Variable Frequency Microwave (VFM) heating, a well-known process taught in at least the following U.S. patents, each of which is incorporated herein by reference in its entirety: U.S. Pat. Nos. 5,321,222; 5,721,286; 5,961,871; 5,521,360; and 5,738,915. For example, U.S. Pat. No. 5,738,915 by Fathi et al. teaches the use of VFM for rapid curing of polymeric films on semiconductor wafers. It should be noted that although single or fixed frequencies can be used for microwave heating of semiconductors, they generally produce non-uniform heating, and when metal films are involved arcing with these films becomes a serious issue. However, the continuous sweeping of frequencies over the bandwidth being used with VFM, as taught in the aforementioned references, reduces the potential for arcing and subsequent damage. Numerous kinds of wafers with integrated circuits have been exposed to VFM and it has been demonstrated that there is no damage to the circuits or their functionality. The use of VFM provides more rapid processing as compared to other annealing furnaces. Additional process monitoring techniques are taught by Fathi et al. in U.S. Pat. No. 5,648,038, the entire disclosure of which is incorporated herein by reference.

The present invention is directed to thermal treatment processes such as activation/annealing, oxidation and reaction of a metal film with the silicon substrate to form silicides undergoing the phase transformation, and associated methods for in-situ monitoring of the process.

In a high-volume production environment it is critical to measure and control temperature for any thermal process. There are challenges measuring and controlling peak temperatures in spike-anneal process. In most cases non-contact IR temperature monitoring is desirable, but handling wafers with varying emissivities is a challenge. As a matter of fact, even on a single wafer the emissivity typically changes with time as the annealing process progresses.

In the dopant activation process (for example, in ultra shallow junction devices) as the wafer is annealed, the conductivity of the surface changes, hence the emissivity of the surface changes too. In the silicide formation process, as the phase transformation occurs it changes the resistivity and the emissivity of the phase forming on the surface. The same is true during the thermal oxidation of silicon process. Applicants have discovered that this change in emissivity may be usefully employed to provide in-situ monitoring of the process, as will be shown in several examples that follow. It will be understood that the term monitoring includes the possible incorporation of an active control system that controls one or more process variables in real time based on the emissivity changes. Alternatively, the invention may be used simply to observe emissivity changes during a process setup or the development of a process recipe.

For a fuller understanding of the invention, it is useful to review briefly the general concepts relating to emissivity. All surfaces absorb and emit thermal radiation. However, for any given temperature and wavelength, there is a maximum amount of radiation that any surface can emit. If a surface can emit this maximum amount of radiation, it is known as a blackbody. Emissivity ($\in$) is the ratio of radiation emitted by a surface relative to the theoretical value predicted by Planck's law. Most surfaces are not blackbody emitters and emit some fraction of the amount of thermal radiation as compared to a blackbody. Thus, by definition the emissivity of a blackbody is unity and all real materials will exhibit emissivities less than unity. A material's surface emissivity is a measure of the energy emitted when a surface is directly viewed. If a surface emits half as much radiation at a given wavelength and temperature as a blackbody, it is said to have an emissivity of 0.5. Surface emissivity is generally measured indirectly by assuming that $\in = 1$ −reflectivity. A mirrored surface may reflect 98% of the energy, while absorbing 2% of the energy. A good blackbody surface will reverse the ratio, absorbing 98% of the energy and reflecting only 2%. Most organic, painted, or oxidized surfaces have emissivity values close to 0.95.

The measured emissivity of an object is dynamic and is typically affected by several variables, the most important of which are the object's material and its geometric shape, how the light is emitted including angle and surroundings, surface condition and texture, surface coatings or films, the uniformity of the object's temperature and the wavelength dependence. The outer most atomic layers and the vibratory modes of the outer most atoms emit the measurable radiation. The intrinsic atomic bonding that exists between the atoms and the configuration of the atoms forming the surface are the most contributors to the measurable radiation. One can appreciate that changes the configuration or the bonding forces between the outer most atomic layers would result in changes in the intensity and/or the wavelength of emitted radiation. Furthermore, the subject is made more complex when considering layered structures (forming heterogeneous materials); the simple concept of emissivity can very quickly become a very complex topic especially in view of chemical changes, reactions that may be taking place that in turn affect the chemical bonding and hence emitted radiation.

FIG. 1 shows a plot of the typical emissivity of a surface. Note that the emissivity of the same surface changes with the sampling wavelength. This makes IR temperature measurements sensitive to the device and wavelength used.

With the sensitivity of emissivity to a number of variables described above, Applicants surmised that emissivity will be sensitive to the state of the semiconductor surface. As a matter of fact for longer wavelengths, Si is transparent to IR radiation so the IR temperature-monitoring device may actually be measuring the temperature at some point past or through silicon wafer. Generally the emissivity of silicon is 0.6-0.8 depending on the finish on the surface. In an oxidation process as silicon dioxide grows on the surface of the silicon wafer the emissivity increases to 0.95, provided that a sufficient thickness of oxide is grown.

Metal surfaces with a good polished finish could have an emissivity in the 0.05-0.4 range. However, when the same surface reacts with oxygen to form an oxide the emissivity can go as high as 0.95 and the same applies to reactions with other materials. Nickel deposited on a polished surface (e.g. silicon wafer) will have a very low emissivity around 0.05. When oxidized it climbs to 0.6 and forming an alloy with chromium and iron increases it to 0.9. Thus it is natural to expect the emissivity to rise when forming any nickel silicide phase during the reaction of nickel with silicon.

During the ion implantation process the heavy ions can easily knock out silicon atoms and silicon crystal structure is damaged and the doped surface layer conductivity drops. The wafer and fabricated (USJ) devices need to be annealed to activate the dopant and provide conductivity, which is usually measured as the drop in sheet resistance. During this activation process as the conductivity of the surface changes it will be accompanied by a change in surface emissivity too.

Being able to monitor emissivity changes for processes such as those described above forms a major aspect of the present invention. As the emissivity of the surface changes, the temperature being displayed on an IR-based temperature device will also change (even if the actual temperature of the object is constant). It follows from this that if two temperature-monitoring devices are provided, the first one may be configured to be sensitive to the emissivity changes and the second one may be configured to be relatively insensitive to emissivity over some selected part of the optical spectrum. The second device therefore serves as the primary process temperature controller, while the first device provides emissivity information used in the inventive process monitor and control strategy.

While there are relationships and dependencies between film thickness and emissivity, the present invention (and the examples presented herein) does not intend to detail all the possible secondary effects that combine to influence the overall emissivity measurement in particular ranges of wavelength, nor does the user need to understand explicitly how emissivity is changing from a theoretical or mechanistic standpoint. Rather, the invention simply relies on the fact that as the workpiece is processed, changes can occur in the measured emissivity and these changes may be used as a process monitoring parameter regardless of the exact physical mechanism causing a particular emissivity change.

For example, in a multilayered structure, particularly when the individual layers are very thin, it is possible that upper most layers change emissivity and stabilize; however if the following two conditions are fulfilled, further emissivity variation may be observable. These conditions include such cases as: a) the upper most layers are very thin and hence permit some transmission; and, b) the second layers (immediately below the upper most layers) undergo a transformation that changes the emitted radiation, a portion of which is transmitted to the surface. In these cases, a secondary emissivity change can be observable. Both these cases are within the spirit of the method taught herein.

Figure 2:
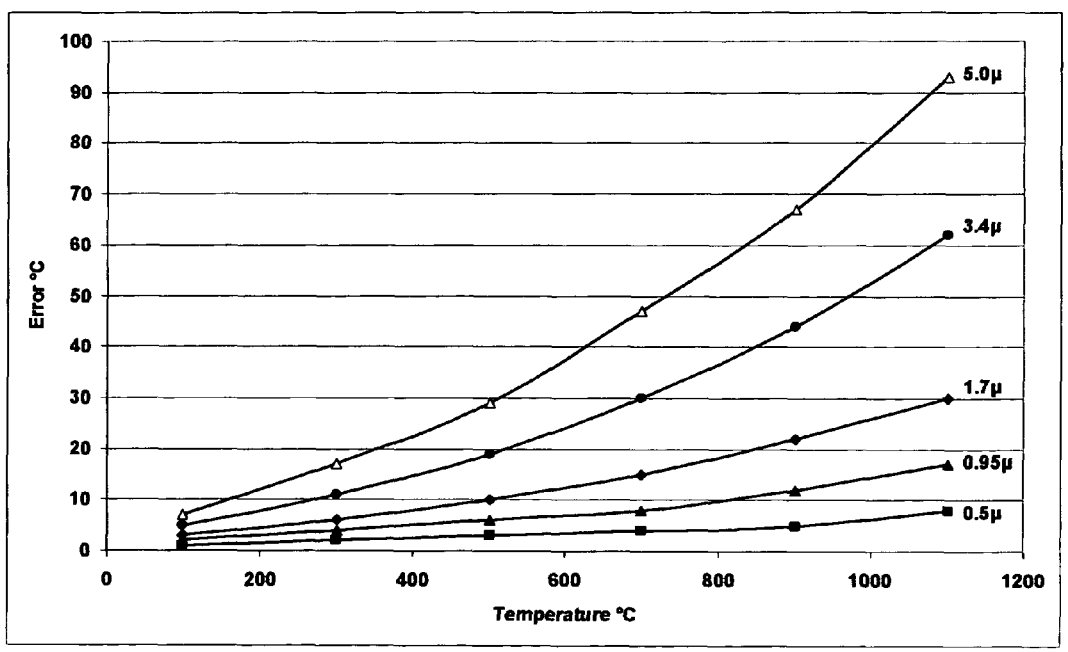
FIG. 2 shows a plot of measurement error versus temperature for IR-based measurements at temperatures up to 500° C. using various IR wavelengths.

Silicon is transparent at wavelengths longer than 1.1 μm and this is known to make IR temperature monitoring with longer wavelengths more difficult. However, using shorter wavelengths the emissivity changes and the corresponding measurement errors are substantially reduced as can be seen in the graph presented in FIG. 2 at the temperatures of interest (up to 500° C. or so).

In addition to using shorter wavelengths if single crystal sapphire light pipes are used they are easy to integrate into the process chamber because of their small diameter. Sapphire light pipes have a very high melting point and are immune to most corrosive environments and their ability to collect light from a wide angle helps in reducing emissivity and roughness errors.

The following examples will illustrate various aspects of the invention and its use for various processing operations.

EXAMPLE

Figure 3:
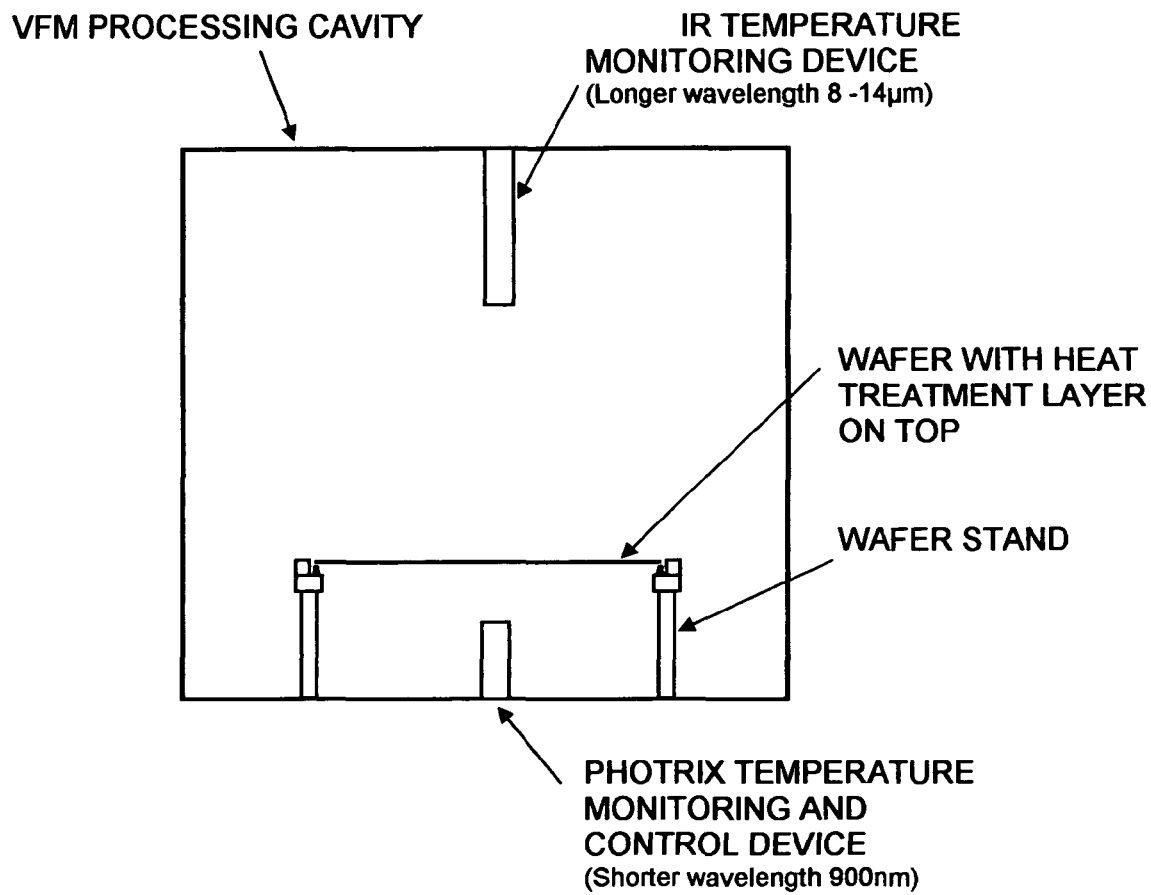
FIG. 3 shows schematically the VFM processing cavity or chamber containing two independent temperature devices viewing the same wafer from the top and bottom.

As shown generally in FIG. 3, a VFM processing cavity or chamber is set up with two temperature devices viewing the same wafer from the top and bottom. The first (longer wavelength) device is positioned to look at the top surface of the wafer that undergoes a change during the process and the second (shorter wavelength) device is positioned to look at the bottom side of the wafer from the bottom of the chamber. The second temperature measurement device, which therefore has little or no errors, controls the process soak temperature, whereas the first temperature measurement device will yield information that will vary as the emissivity of the surface changes. Both of these temperatures can be plotted and observed in real time.

Depending on the particular process, as the semiconductor surface either (a) oxidizes, (b) reacts with a metal coating to form the silicide, or (c) undergoes a change in conductivity because of dopant activation, the change in emissivity will indicate an apparent change in temperature. Since the second (shorter wavelength) temperature measurement device is controlling the temperature, the plot would be a relatively flat line during the soak process. However, during this very soak process the apparent change in temperature as measured by the more emissivity-sensitive device can be used as a probe to monitor the changing emissivity as a proxy for indicating the progress of the aforementioned reactions or the phase changes occurring in the material. This complex issue of emissivity changes can therefore be utilized as the in-situ monitoring of the phase change and is one of the main aspects of the present invention.

EXAMPLE

The experimental arrangement in the VFM processing chamber shown schematically in FIG. 3 was set up in an existing commercially-available VFM system for processing wafers having vacuum and various other capabilities (Micro-Cure 3100 Vacuum Batch System, Lambda Technologies, Inc., 860 Aviation Parkway, Morrisville, N.C.).

One of the dilemmas with optical pyrometers is that some work well only at higher temperatures and others work well at low temperatures only. With two temperature devices monitoring the wafer temperature from the top and bottom in the processing chamber on the system described above they complement each other to cover the entire temperature range. As seen from the plots shown in examples below the (shorter wavelength 0.9 μm) Photrix pyrometer does not even start measurements until 190° C. During this low temperature range the temperature is being monitored and recorded by the longer wavelength (8-14 μm) IR device. As the temperature increases where the pyrometer measurements are stable, the IR device becomes more sensitive to the emissivity changes and hence displays an apparent temperature that differs slightly. Since the MicroCure 3100 system has the capability to plot both the indicated temperatures (IR and pyrometer) in real time, the change in emissivity and corresponding change in the indicated temperature can act as an in-situ monitor of the various annealing processes.

Although the system in the foregoing example used two "one-color" pyrometers, operating at different wavelengths, it will be appreciated that the invention may also be carried out using a first, one-color pyrometer and a second, two-color pyrometer. A one-color pyrometer essentially measures the amount of optical emission at a single wavelength; total emission is temperature dependent in a known way, but as noted above, it is also dependent on emissivity. A two-color pyrometer measures the relative intensities of emission at two different wavelengths; this relationship is also well known as a function of temperature, but has the advantage that it is relatively less sensitive to overall emissivity. Both types of instruments are available in many models and configurations from many manufacturers. One-color systems include models CI, CM, GP, MI, and MI3 (Raytek Corp., Santa Cruz, Calif.); and the IMPAC IS 12 and IGA 12 (LumaSense Technologies, Oakland, N.J.). Some two-color systems include models ISQ5, ISQ5-LO, and M770S (LumaSense Technologies, Oakland, N.J.); and model DP1541 (Omega Engineering, Stamford, Conn.).

The following examples will illustrate how the inventive method may be used to monitor the progress of several important processes of interest in semiconductor manufacturing.

EXAMPLE

Activation of Implanted Dopants

Figure 4:
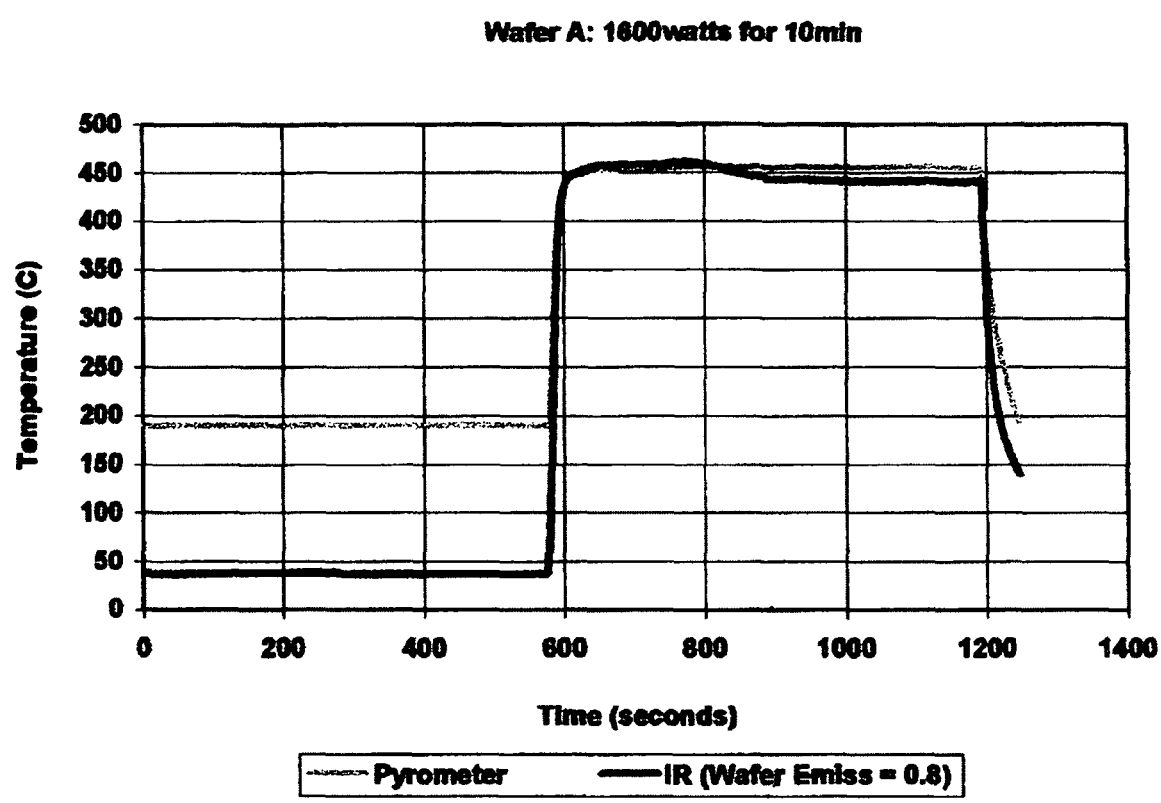
FIG. 4 shows a plot of the output of two temperature-monitoring devices, one of which is more sensitive to emissivity than the other. The apparent temperature decrease measured by the more emissivity-sensitive device serves as a proxy for changing emissivity as the sample is processed. In this case, the process involves thermal activation of implanted dopants
Figure 7:
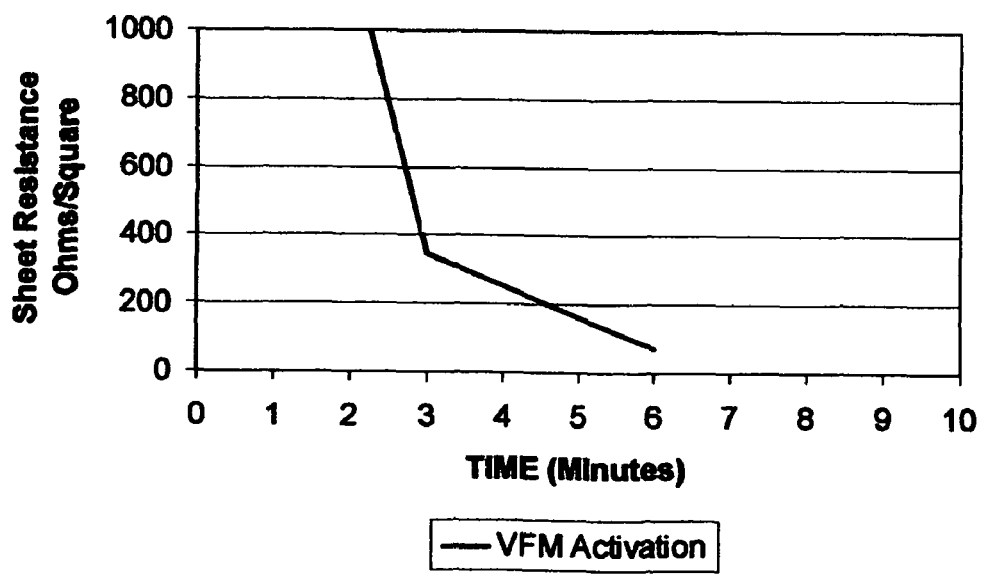
FIG. 7 shows a plot of sheet resistance versus time for dopant activation in a silicon wafer. Before anneal (or activation) sheet resistance number are very high (several thousand Ω/square). After 3 minutes of anneal sheet resistance is 344 and after 6 minutes of anneal it is 75 Ω/square, which is the desired endpoint.

During the annealing process of ion-implanted damage, the electrical activation of dopant significantly changes the emissivity of the wafer surface. As the emissivity increase the corresponding temperature measured by the IR device drops and the abrupt drop is shown in the figure below. Note that the temperature on the shorter wavelength pyrometer (bottom) remains the same during the entire process. Thus monitoring the temperature drop on the IR device can act as the means for in-situ monitoring of the dopant activation process. Once the transition has occurred with no further changes, the process can be considered to be complete and continuing the process may not be necessary (past say around 950 seconds) in FIG. 4. The sheet resistance measurements on the processed wafers had values as low as 75 Ω/square, a value indicative of complete activation, as shown in FIG. 7. The plot in FIG. 4 is for a longer (10 minutes) soak intended to capture the entire process. The soak time starts a little before 600 seconds. After 3 minutes of soak time the sheet resistance was 344 Ω/square, and after 6 minutes of soak (around 950 seconds) the sheet resistance drops to 75 Ω/sq which coincides with the change in (apparent) temperature corresponding to the change in emissivity. Although the exact time and temperature may vary depending on particular dopants and implant parameters, the skilled artisan will appreciate that the concept of emissivity change with dopant activation is general and can be applied to many similar processes.

The preceding example shows that the inventive method can be usefully employed for in situ monitoring of the progress of annealing and dopant activation in a semiconductor wafer. Although the foregoing example specifically used a silicon wafer, it will be appreciated that analogous physical principles apply to other semiconducting materials as well. Some other suitable semiconductor materials include SiGe, GaAs, GaN, SiC, and AlN.

EXAMPLE

Reaction of Metal Coatings with Wafer to Form Silicides

Figure 5:
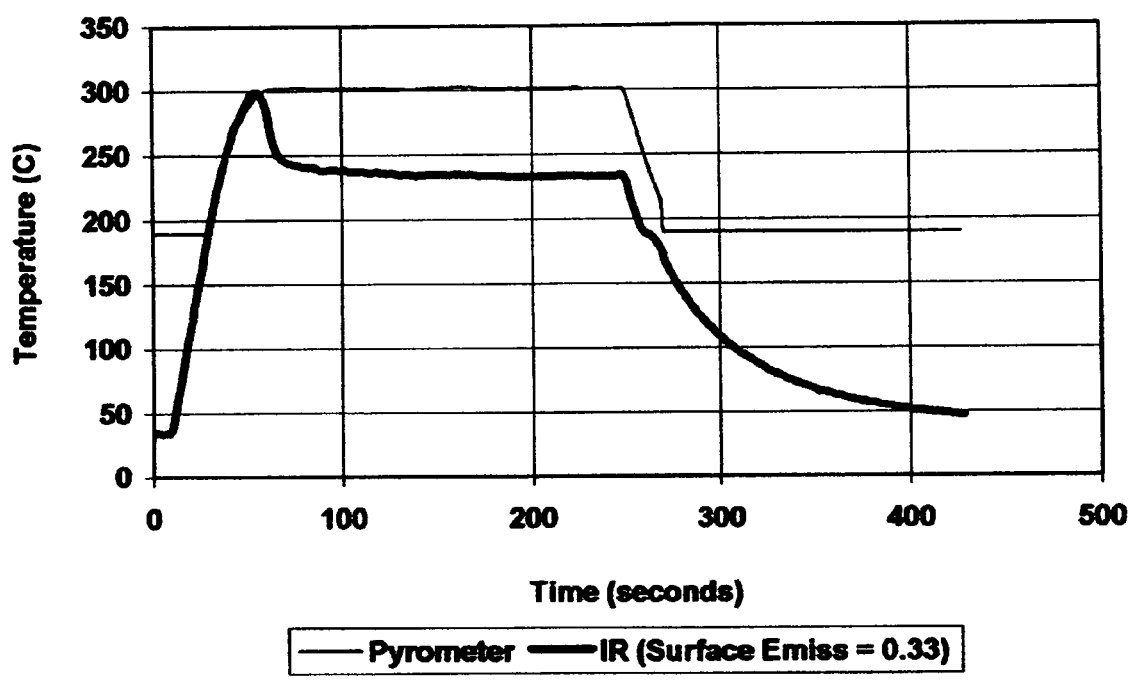
FIG. 5 shows typical plots of measurements taken as in FIG. 4, but in this case applied to the process of reacting a metal coating to form a silicide layer on Si. The soak temperature for this process controlled by the pyrometer was 300° C.

Metal (Ti, Co, and Ni) silicide layers are typically fabricated by first evaporating or sputtering a thin metal film on the semiconductor substrate and then heating it to allow the metal film to react with silicon to form the silicide layer. FIG. 5 shows the plots for a typical process in the apparatus described above and shown in FIG. 3.

The metal-coated wafer is placed in the process chamber with the temperature devices monitoring temperatures from the top and bottom, respectively. The semiconductor substrate is held at 300° C. as shown in FIG. 5. The metal films generally have a low emissivity values (0.33 in this case) and as the reaction between the metal and silicon starts forming the intermediate phases the emissivity increases. As the NiSi phase forms there is an increase in conductivity, which causes the emissivity to decrease, and the apparent temperature drops abruptly to temperatures below 250° C., while the real temperature as monitored by the pyrometer is still 300° C. The skilled artisan will appreciate that one could therefore end the soak after ~100 s based on the new process control information, thereby reducing the thermal budget significantly.

Figure 6:
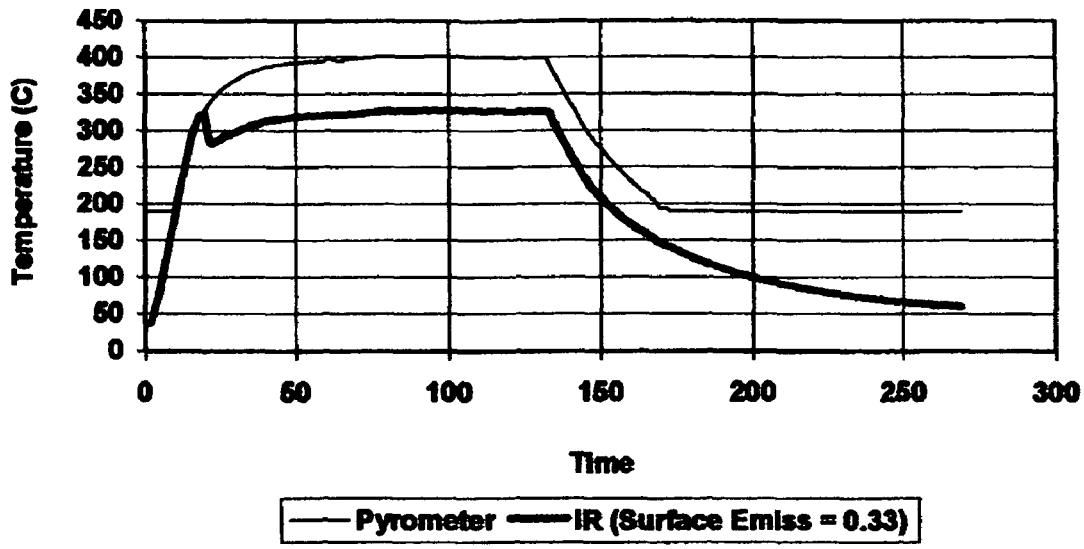
FIG. 6 shows plots similar to those in FIG. 5 but using a soak temperature of 400° C.

However, in another experiment higher power and a higher soak temperature of 400° C. was selected, the results of which are plotted in FIG. 6. As the temperature ramps up, the intermediate silicide starts to form and as the real temperature exceeds 350° C., one observes an abrupt drop in the apparent temperature on the IR device that corresponds to the in increase in conductivity and decrease in emissivity of the NiSi phase. Since the actual soak temperature was higher 400° C., the IR temperature also continues to increase. It will be noted that for this plot where the soak temperature is 400° C., as the temperature ramps quickly past 300° C. the (emissivity dependent) drop in IR temperature is not as prominent as it was for the 300° C. soak process.

For the current example the sheet resistance of the metal was in the 20-25 Ω/square range which climbs up and then drops to below 10 Ω/square for both the 300° C. and 400° C. soak temperature runs, indicating the formation of the desired phase.

The preceding example shows that the inventive process may be usefully employed for processes involving the reaction of a metal coating with a silicon substrate. Various applications may have different acceptable or desirable resistivity levels and the skilled artisan can determine the best soak temperature and the corresponding emissivity and apparent temperature changes to track the progress of the silicide reaction through routine experimentation.

The MicroCure 3100 VFM system used in the preceding two examples has, among other things, the ability to monitor the amount of reflected power (i.e., the microwave power that was not absorbed by the load or otherwise dissipated in the cavity). During the experiments described in the examples, Applicants noted that changes in reflected power also accompanied the progress of the reactions that were being effected in the workpiece. Thus, it will be appreciated that the inventive method may be further enhanced by the deliberate measurement of reflected power as an additional processing parameter. It will further be appreciated that the reflected power may be measured as an "average" value (scalar measurement) or it may be measured as a function of frequency (vector measurement) as taught generally in U.S. Pat. No. 5,521,360.

EXAMPLE

Wafer Oxidation

As noted earlier, the oxidation of silicon to form $SiO_2$ as an insulating dielectric layer in semiconductor device fabrication is another critical process in modern semiconductor manufacturing. A bare silicon surface has emissivity of 0.6-0.8 depending on the finish on the surface. During the oxidation process, as silicon dioxide grows on the surface, the emissivity will typically increase to a value characteristic of $SiO_2$ ($\in$=0.95) which, as in the two preceding examples, lends itself to the inventive method in which apparent temperature as monitored by the IR temperature device could be used determine the progress of the oxidation process.

Based on the foregoing examples, the skilled artisan will appreciate that the inventive method can be used to improve process control in many processes of interest to the semiconductor manufacturer. The inventive apparatus can be constructed using readily available components, and the inventive method can be adapted to a wide variety of specific processes with only routine experimentation, particularly because the emissivities of many materials of interest have already been tabulated.

It will be appreciated that the inventive method allows the skilled operator to control a semiconductor manufacturing process based on a real-time in situ measurement of the actual progress of a particular reaction as indicated by how that reaction changes the emissivity of the semiconductor device. In the examples specifically described, the primary process control variable is temperature (peak temperature, soak time, and ramp rate); however, it will be appreciated that many other process variables can be controlled using the information that the invention provides regarding the status of the process being carried out. Some of these other variables include the introduction of various process gases, vacuum levels, cooling rates, and the like.

It will further be appreciated that the invention may be used in systems that employ other means for heating the workpiece, including convective heating, radiant heating, resistive heating, and so forth.

Although many of the exemplary embodiments of the invention are directed to the specific processes involved in semiconductor manufacturing, it will be appreciated that the inventive technique is a general one and can be applied to many other materials and processes in which a change in surface emissivity can be used as a proxy for physical or chemical changes that take place during thermal processing. For example, the growth of a surface coating by chemical vapor deposition may be monitored using the inventive concept. Other applications include: metallization and plating, growth of passivating films on metals; growth of hard coatings by CVD; nitridation reactions; carburization reactions, sintering, etc. In such cases, the processing chamber might maintain a selected atmosphere containing a source of nitrogen or carbon (e.g., ammonia or methane), a reducing atmosphere such as hydrogen or hydrogen/argon mixtures, inert gas, oxygen at a selected partial pressure, etc. It will further be appreciated that the workpiece may be of any desired size and shape, and is not limited to flat wafers as are common in semiconductor processing. As used herein, the term workpiece may define a single object being processed individually or a batch of substantially similar objects being processed together; in the latter case, both temperature measurement devices would preferably look at the same object, and the emissivity changes in that object would serve as a proxy for the processing status of the entire batch of objects.

In several of the examples, Applicants have interpreted the observed data based on postulated physical mechanisms; however, it is important to note that the exact physical basis for any particular reading may be different or it may be the result of several competing physical processes such as surface conductivity, surface roughness, partial transmission through the surface layer or the substrate, etc. Applicants do not intend for the invention to be limited to a particular physical explanation or theory. On the contrary, the invention is based simply on the experimental measurement of the divergences between the temperatures indicated by two pyrometers, one of which is relatively more sensitive to changes in surface emissivity than is the other one, and using the divergence to indicate the changes occurring on a surface as a means of process control. Through routine experimentation, the skilled artisan can readily adapt the invention to particular thermal processing applications.

We claim:

1. An apparatus for processing a semiconductor comprising:
   a thermal processing chamber including a heating source;
   a first noncontacting thermal measurement device positioned to measure temperature on a first area of said semiconductor by a one-color measurement in the IR range around 8 to 14 µm; and,
   a second noncontacting thermal measurement device, different from said first noncontacting thermal measurement device, positioned to measure temperature on a second area of said semiconductor by a one-color measurement in the IR range around 0.9 µm, so that said first device is relatively more sensitive to changes in surface emissivity than said second noncontacting thermal measurement device.

2. The apparatus of claim 1 wherein said heating is selected from the group consisting of: convection heating, radiant heating, resistive heating, and microwave heating.

3. The apparatus of claim 1 wherein said semiconductor comprises a material selected from the group consisting of: Si, SiGe, GaAs, GaN, SiC, and AlN.

4. The apparatus of claim 1 wherein said thermal processing chamber further maintains a selected process atmosphere in contact with said semiconductor.

5. The apparatus of claim 4 wherein said process atmosphere is selected from the group consisting of: air, vacuum, inert gas, oxygen, nitrogen, hydrogen, and carbon.

6. The apparatus of claim 1 wherein said semiconductor comprises Si with a layer of metal on at least one surface thereof, and said thermal processing comprises a reaction of said metal and said silicon to form a selected metal silicide phase.

7. The apparatus of claim 6 wherein said metal is selected from the group consisting of: Ni, Ti, and Co.

8. An apparatus for processing a semiconductor comprising:
   a thermal processing chamber including a heating source;
   a first noncontacting thermal measurement device positioned to measure temperature on a first area of said semiconductor by a one-color optical pyrometry; and,
   a second noncontacting thermal measurement device, different from said first device, positioned to measure temperature on a second area of said semiconductor by two-color optical pyrometry.

9. The apparatus of claim 8 wherein said heating is selected from the group consisting of: convection heating, radiant heating, resistive heating, and microwave heating.

10. The apparatus of claim 8 wherein said semiconductor comprises a material selected from the group consisting of: Si, SiGe, GaAs, GaN, SiC, and AlN.

11. The apparatus of claim 8 wherein said thermal processing chamber further maintains a selected process atmosphere in contact with said semiconductor.

12. The apparatus of claim 11 wherein said process atmosphere is selected from the group consisting of: air, vacuum, inert gas, oxygen, nitrogen, hydrogen, and carbon.

13. The apparatus of claim 8 wherein said semiconductor comprises Si with a layer of metal on at least one surface thereof, and said thermal processing comprises a reaction of said metal and said silicon to form a selected metal silicide phase.

14. The apparatus of claim 13 wherein said metal is selected from the group consisting of: Ni, Ti, and Co.

15. A method for processing a semiconductor comprising the following steps:
   a) placing a semiconductor in a thermal processing chamber;
   b) positioning a first noncontacting thermal measurement device to measure temperature on a first area of said semiconductor by a one-color measurement in the IR range around 8 to 14 µm;
   c) positioning a second noncontacting thermal measurement device to measure temperature on a second area of said semiconductor, by a one-color measurement in the IR range around 0.9 µm, so that said first noncontacting thermal measurement device is relatively more sensitive to changes in surface emissivity than said second noncontacting thermal measurement device;

d) heating said semiconductor while simultaneously measuring the output of said first and second thermal measurement devices and using the difference in outputs between said first and second thermal measurement devices to control at least one processing variable.

16. The method of claim 15 wherein said semiconductor comprises a material selected from the group consisting of: Si, SiGe, GaAs, GaN, SiC, and AlN.

17. The method of claim 15 wherein said heating is selected from the group consisting of: convection heating, radiant heating, resistive heating, and microwave heating.

18. The method of claim 15 further comprising the step of:
e) maintaining a selected process atmosphere in contact with said semiconductor.

19. The method of claim 18 wherein said process atmosphere is selected from the group consisting of: air, vacuum, inert gas, oxygen, nitrogen, hydrogen, and carbon.

20. The method of claim 15 wherein said semiconductor comprises Si with a layer of metal on at least one surface thereof, and said thermal processing comprises a reaction of said metal and said silicon to form a selected metal silicide phase.

21. A method for processing a semiconductor comprising the following steps:
a) placing a semiconductor in a thermal processing chamber;
b) positioning a first noncontacting thermal measurement device to measure temperature on a first area of said semiconductor by one-color optical pyrometry;
c) positioning a second noncontacting thermal measurement device to measure temperature on a second area of said semiconductor, by two-color optical pyrometry, so that said first noncontacting thermal measurement device is relatively more sensitive to changes in surface emissivity than said second noncontacting thermal measurement device;
d) heating said semiconductor while simultaneously measuring the output of said first and second thermal measurement devices and using the difference in outputs between said first and second thermal measurement devices to control at least one processing variable.

22. The method of claim 21 wherein said semiconductor comprises a material selected from the group consisting of: Si, SiGe, GaAs, GaN, SiC, and AlN.

23. The method of claim 21 wherein said heating is selected from the group consisting of: convection heating, radiant heating, resistive heating, and microwave heating.

24. The method of claim 21 further comprising the step of:
e) maintaining a selected process atmosphere in contact with said semiconductor.

25. The method of claim 24 wherein said process atmosphere is selected from the group consisting of: air, vacuum, inert gas, oxygen, nitrogen, hydrogen, and carbon.

26. The method of claim 21 wherein said semiconductor comprises Si with a layer of metal on at least one surface thereof, and said thermal processing comprises a reaction of said metal and said silicon to form a selected metal silicide phase.

27. A method for processing materials comprising the following steps:
a) placing a workpiece of a selected material in a thermal processing chamber;
b) positioning a first noncontacting thermal measurement device to measure temperature on a first area of said workpiece by a one-color measurement in the IR range around 8 to 14 µm;
c) positioning a second noncontacting thermal measurement device to measure temperature on a second area of said workpiece, by a one-color measurement in the IR range around 0.9 µm, so that said first noncontacting thermal measurement device is relatively more sensitive to changes in surface emissivity than said second noncontacting thermal measurement device;
d) heating said workpiece while simultaneously measuring the output of said first and second thermal measurement devices and using the difference in outputs between said first and second thermal measurement devices to control at least one processing variable.

28. The method of claim 27 wherein said thermal processing comprises a process selected from the group consisting of: heating, annealing, dopant activation, silicide formation, carburization, nitridation, sintering, oxidation, vapor deposition, metallization, and plating.

29. The method of claim 27 wherein said processing variable is selected from the group consisting of: peak temperature, temperature profile, soak time, ramp rate, concentration of a selected process gas, vacuum level, and cooling rate.

30. A method for processing materials comprising the following steps:
a) placing a workpiece of a selected material in a thermal processing chamber;
b) positioning a first noncontacting thermal measurement device to measure temperature on a first area of said workpiece by one-color pyrometry;
c) positioning a second noncontacting thermal measurement device to measure temperature on a second area of said workpiece, by two-color pyrometry, so that said first noncontacting thermal measurement device is relatively more sensitive to changes in surface emissivity than said second noncontacting thermal measurement device;
d) heating said workpiece while simultaneously measuring the output of said first and second thermal measurement devices and using the difference in outputs between said first and second thermal measurement devices to control at least one processing variable.

31. The method of claim 30 wherein said thermal processing comprises a process selected from the group consisting of: heating, annealing, dopant activation, silicide formation, carburization, nitridation, sintering, oxidation, vapor deposition, metallization, and plating.

32. The method of claim 30 wherein said processing variable is selected from the group consisting of: peak temperature, temperature profile, soak time, ramp rate, concentration of a selected process gas, vacuum level, and cooling rate.

* * * * *